United States Patent
Sasaki

(10) Patent No.: US 7,345,498 B2
(45) Date of Patent: Mar. 18, 2008

(54) METHOD AND MEASUREMENT PROGRAM FOR BURN-IN TEST OF TWO SEMICONDUCTOR DEVICES SIMULTANEOUSLY

(75) Inventor: Suguru Sasaki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 24 days.

(21) Appl. No.: 11/236,617

(22) Filed: Sep. 28, 2005

(65) Prior Publication Data

US 2006/0066340 A1 Mar. 30, 2006

(30) Foreign Application Priority Data

Sep. 30, 2004 (JP) ............................. 2004-285666

(51) Int. Cl.
*G01R 31/26* (2006.01)
(52) U.S. Cl. ..................... 324/765; 324/754; 324/762
(58) Field of Classification Search ........ 324/754–762; 439/482; 438/14–18; 714/724
See application file for complete search history.

(56) References Cited

U.S. PATENT DOCUMENTS

| 4,956,605 | A | * | 9/1990 | Bickford et al. ............. 324/760 |
| 5,412,314 | A | * | 5/1995 | Fukunaga et al. ........ 324/158.1 |
| 6,404,219 | B1 | * | 6/2002 | Yamamoto .................... 324/765 |
| 6,630,685 | B1 | * | 10/2003 | Lunde ......................... 257/48 |
| 6,701,474 | B2 | * | 3/2004 | Cooke et al. ................ 714/724 |

* cited by examiner

*Primary Examiner*—Vinh P. Nguyen
(74) *Attorney, Agent, or Firm*—Young & Thompson

(57) ABSTRACT

A method for a burn-in test includes steps (a) and (b). In the step (a), an operation test of a first semiconductor device is executed through first probes provided on a probe card. In the step (b), a stress is applied to a second semiconductor device through second probes provided on the probe card while the operation test is executed.

10 Claims, 8 Drawing Sheets

METHOD AND MEASUREMENT PROGRAM FOR BURN-IN TEST OF TWO SEMICONDUCTOR DEVICES SIMULTANEOUSLY

BACKGROUND OF THE INVENTION

1. Field of the Invention

The present invention relates to a method for a burn-in test.

2. Description of the Related Art

Various mounting techniques are developed to attain a high density mounting of a semiconductor device. For example, TAB (Tape Automated Bonding) or COF (Chip on Film) is often employed to mount the semiconductor device on a carrier tape for a liquid crystal driver IC. Also, CSP (Chip Size Packaging) or MCP (Multi-Chip Package) is often employed for a portable apparatus IC.

One of items to be considered in employing the foregoing mounting techniques is an execution method for a burn-in. To secure KGD (Known Good Die) having a high reliability, it is essentially necessary to execute the burn-in. However, when the mounting technique such as the TAB, COF, CSP or MCP is employed, the burn-in using a burn-in board can not be executed unlike in the case of a typical semiconductor device. For the mounting technique such as the TAB, COF, CSP or MCP, it is necessary to execute the burn-in without using the burn-in board.

To execute the burn-in without using the burn-in board, the burn-in technique using probes is considered. One of the examples is a wafer level burn-in (WLBI) technique in which the burn-in is performed on a semiconductor device in its original wafer. Japanese Laid Open Patent Application JP 2003-297887A discloses the WLBI technique. In the wafer level burn-in, the probes are brought into contact with the semiconductor device on the original wafer, and stress is applied through the probes to the semiconductor device.

One problem of the burn-in test technique that uses the probes lies in a long testing time. To make the testing time shorter, it is preferable to simultaneously apply the burn-in to many semiconductor devices by using a single probe card. For example, in the wafer level burn-in technique, it is ideal to simultaneously apply the burn-in to all the semiconductor devices formed in one wafer by using the single probe card. However, the simultaneous application of the burn-in to the many semiconductor devices makes the securing of the reliability of the electrical connection between the probe and the semiconductor device difficult. Actually, the plurality of the tests must be inevitably executed for testing the semiconductor devices. However, if the plurality of the tests is executed for testing the semiconductor devices, this correspondingly leads to the increase in the testing time. The increase in the testing time is not preferable because it causes the increase in a testing cost.

In view of the foregoing background, it is desired to provide a technique for reducing the testing time of the burn-in test using the probe.

SUMMARY OF THE INVENTION

It is therefore an object of the present invention to reduce the testing time necessary for the burn-in test that executes the burn-in by bringing the probe into contact with the semiconductor device.

In order to achieve an aspect of the present invention, the present invention provides a method for a burn-in test including: (a) executing an operation test of a first semiconductor device through first probes provided on a probe card; and (b) applying a stress to a second semiconductor device through second probes provided on the probe card while the operation test is executed.

In this method for a burn-in test, since the operation test of the first semiconductor device and the burn-in of the second semiconductor device are simultaneously executed, the throughput of the operation test and the burn-in can be substantially improved and the testing time of the burn-in test can be effectively reduced.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

Embodiments of a method for a burn-in test according to the present invention will be described below with reference to the attached drawings.

First Embodiment

In the first embodiment, the method for the burn-in test according to the present invention is applied to a wafer level burn-in technique. The method for the wafer level burn-in test in this embodiment schematically executes a burn-in of a second semiconductor device during the execution of an operation test of a first semiconductor device. After the burn-in and the operation test are completed, the burn-in of a third semiconductor device and the operation test of the second semiconductor device are executed. The method for the wafer level burn-in test executing the burn-in and the operation test through the foregoing procedure substantially improves the throughput of the burn-in and the operation test, and effectively reduces the time necessary for a wafer level burn-in inspection.

The facilities and apparatuses to attain the above-mentioned method for the wafer level burn-in test and its detailed procedure will be disclosed below.

Figure 1:
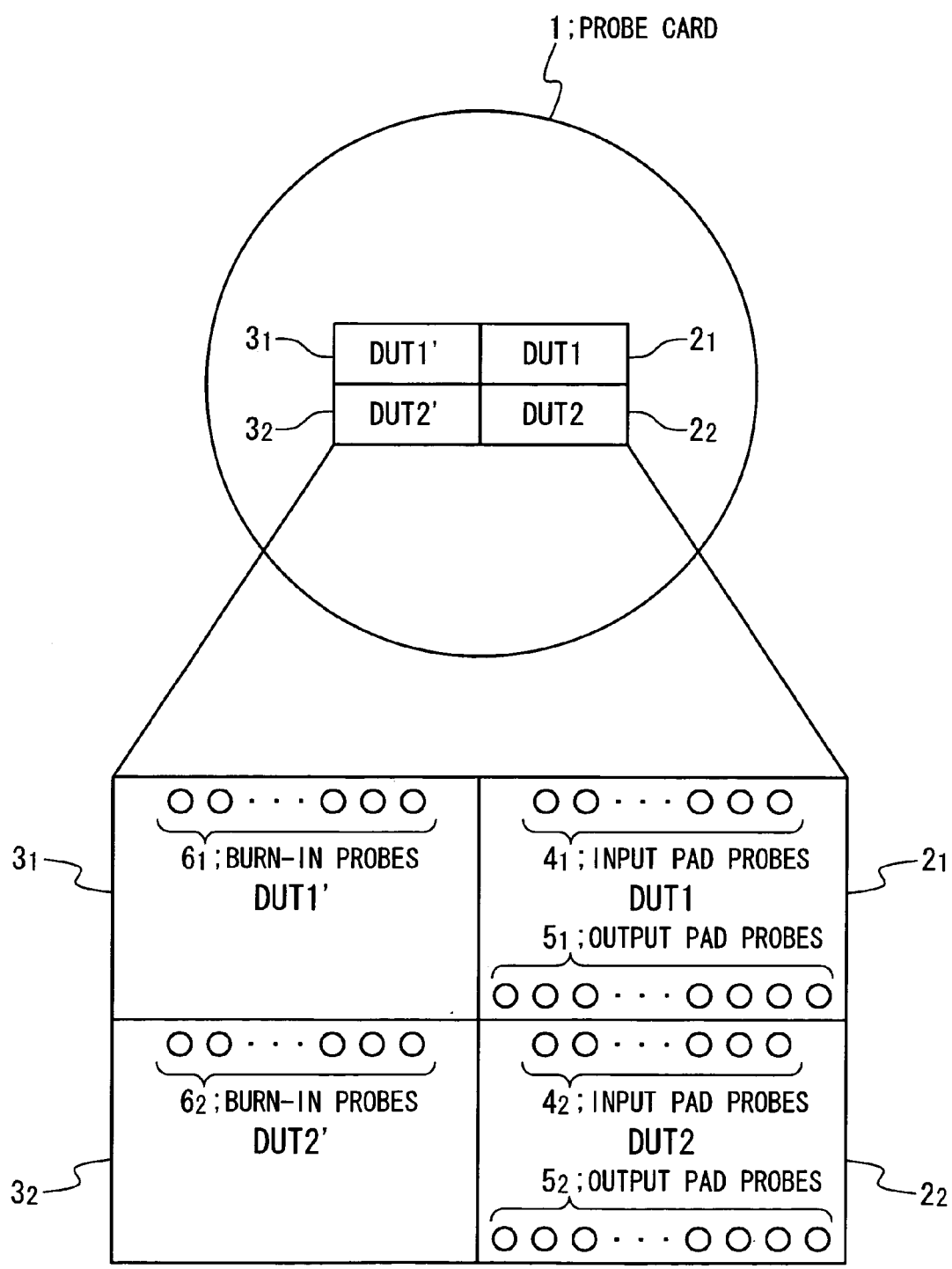
FIG. 1 is a conceptual view showing a configuration of a probe card used in a first embodiment of method for the burn-in test according to the present invention.

FIG. 1 is a conceptual view showing a configuration of a probe card 1 used in the method for the wafer level burn-in test in this embodiment. The probe card 1 is designed such that the operation test can be performed on two semiconductor devices and at the same time, the burn-in can be applied to another two semiconductor devices.

Concretely, four DUT regions, namely, DUT regions $2_1$, $2_2$, $3_1$ and $3_2$ are provided on the probe card 1. Each of these four DUT regions $2_1$, $2_2$, $3_1$ and $3_2$ corresponds to one of four semiconductor devices to which an inspection or burn-in is executed by using the probe card 1. In FIG. 1, to clarify this correspondence, symbols [DUT1], [DUT1'], [DUT2] and [DUT2'] are given to the DUT regions $2_1$, $2_2$, $3_1$ and $3_2$, respectively.

The DUT regions $2_1$ and $2_2$ are the regions where probes, which are used to perform the operation test on the semiconductor device, are provided. Concretely, input pad probes $4_1$ and output pad probes $5_1$ are provided for the DUT region $2_1$. Similarly, input pad probes $4_2$ and output pad probes $5_2$ are provided for the DUT region $2_2$.

The DUT regions $3_1$ and $3_2$ are the regions where the probes, which are used to apply the burn-in to the semiconductor device, are provided. Concretely, burn-in probes $6_1$ are provided for the DUT region $3_1$. Similarly, burn-in probes $6_2$ are provided for the DUT region $3_2$.

Figure 2:
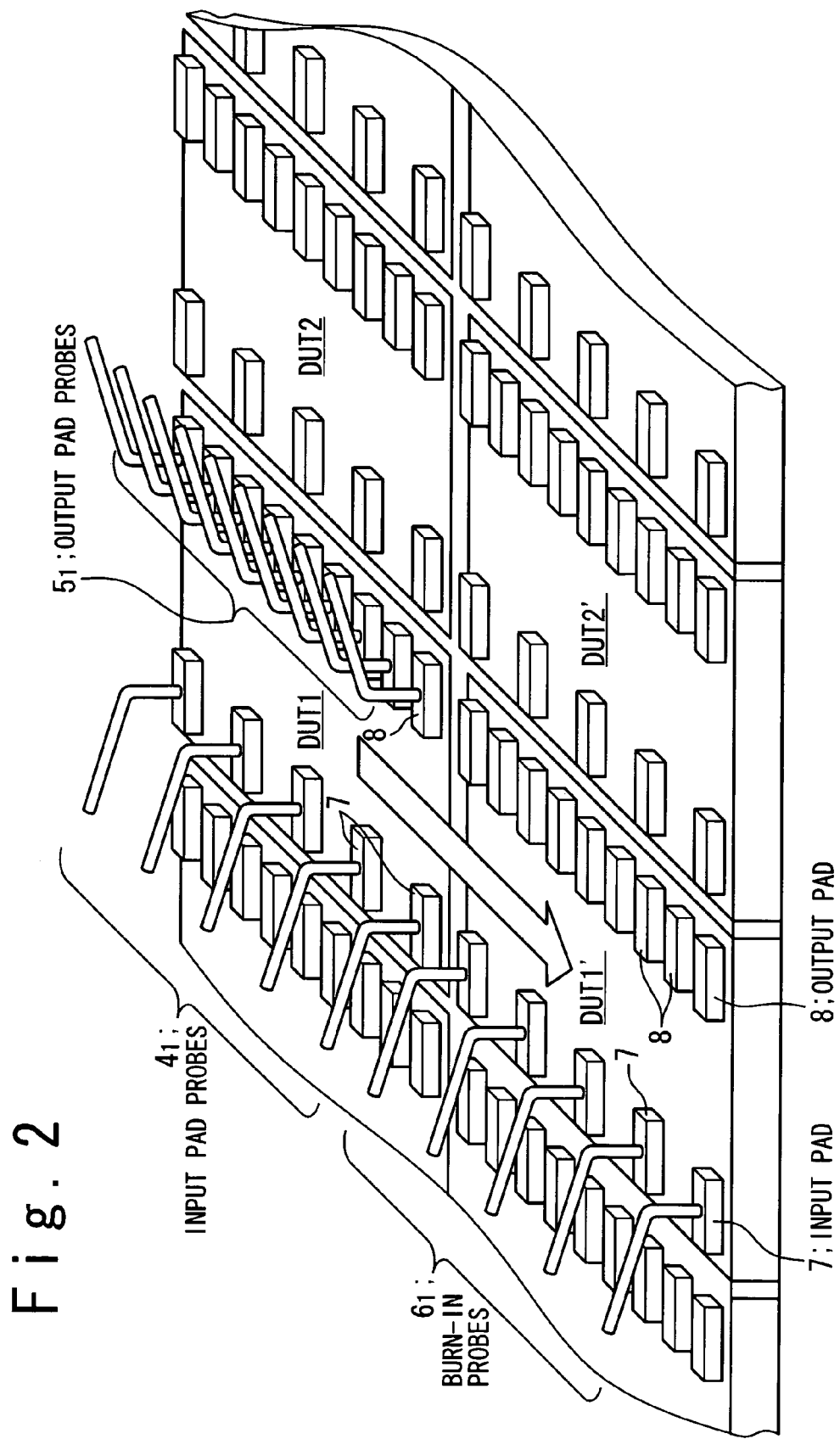
FIG. 2 is a perspective view showing a connection relation between a probe set for the probe card and an input pad and an output pad which are provided in a semiconductor device, in the first embodiment.

Such configuration of the probe card 1 is intended to perform the operation test on the two semiconductor devices by using the input pad probes $4_1$ and the output pad probes $5_1$ and at the same time, apply the burn-in to the other two semiconductor devices by using the burn-in probes $6_2$. FIG. 2 is a perspective view showing a connection relation between the respective probes of the probe card 1 and the pads provided in the semiconductor device in this embodiment. To perform the operation test and the burn-in at the same time, the respective probes of the probe card 1 and the pads provided in the semiconductor devices are connected as shown in FIG. 2. In FIG. 2, the semiconductor devices on which the operation test is performed are represented by symbols DUT1, DUT2, and the semiconductor devices to which the burn-in is applied are represented by symbols DUT1', DUT2'. As is known to one skilled in the art, DUT indicates "Device Under Test". Input pads 7 used for receiving input signals from outside, and output pads 8 used for outputting output signals to the outside are placed in the semiconductor devices DUT1, DUT2, DUT1' and DUT2'.

The probes provided for the DUT regions $2_1$ and $2_2$ are brought into contact with the input pads 7 and output pads 8 of the respective semiconductor devices DUT1 and DUT2 on which the operation test is performed. Concretely, the input pad probes $4_1$ of the DUT region $2_1$ are brought into contact with the input pads 7 of the semiconductor device DUT1, and the output pad probes $5_1$ are brought into contact with the output pads 8 of the semiconductor device DUT1. Similarly, the input pad probes $4_2$ of the DUT region $2_2$ are brought into contact with the input pads 7 of the semiconductor device DUT2, and the output pad probes $5_2$ are brought into contact with the output pads 8 of the semiconductor device DUT2. However, to facilitate visualization of the drawing, the input pad probes $4_2$ and the output pad probe $5_2$ are not shown in FIG. 2. When the operation tests of the semiconductor devices DUT1 and DUT2 are executed, an inspection pattern is supplied from a tester through the input pad probes $4_1$ to the input pads 7 of the semiconductor devices DUT1 and through the input pad probes $4_2$ to the input pads 7 of the semiconductor devices DUT2. Then, an output pattern outputted by the output pads 8 of the semiconductor devices DUT1 is supplied through the output pad probes $5_1$ to the tester. Also, an output pattern outputted by the output pads 8 of the semiconductor devices DUT2 is supplied through the output pad probes $5_2$ to the tester.

On the other hand, the burn-in probes $6_1$ and $6_2$ provided for the DUT regions $3_1$ and $3_2$ are brought into contact with the input pads 7 of the respective semiconductor devices DUT1' and DUT2' to which the burn-in is applied. However, to facilitate visualization of the drawing, the burn-in probe $6_2$ is not shown in FIG. 2. Attention should be paid to the fact that the probe is not brought into contact with the output pads 8 of the semiconductor devices DUT1' and DUT2'. When the burn-in is applied to the semiconductor devices DUT1' and DUT2', a stress pattern of a high voltage is applied from the tester through the burn-in probes $6_1$ to the input pads 7 of the semiconductor device DUT1' and through the burn-in probes $6_2$ to the input pads 7 of the semiconductor device DUT2'.

Figure 3:
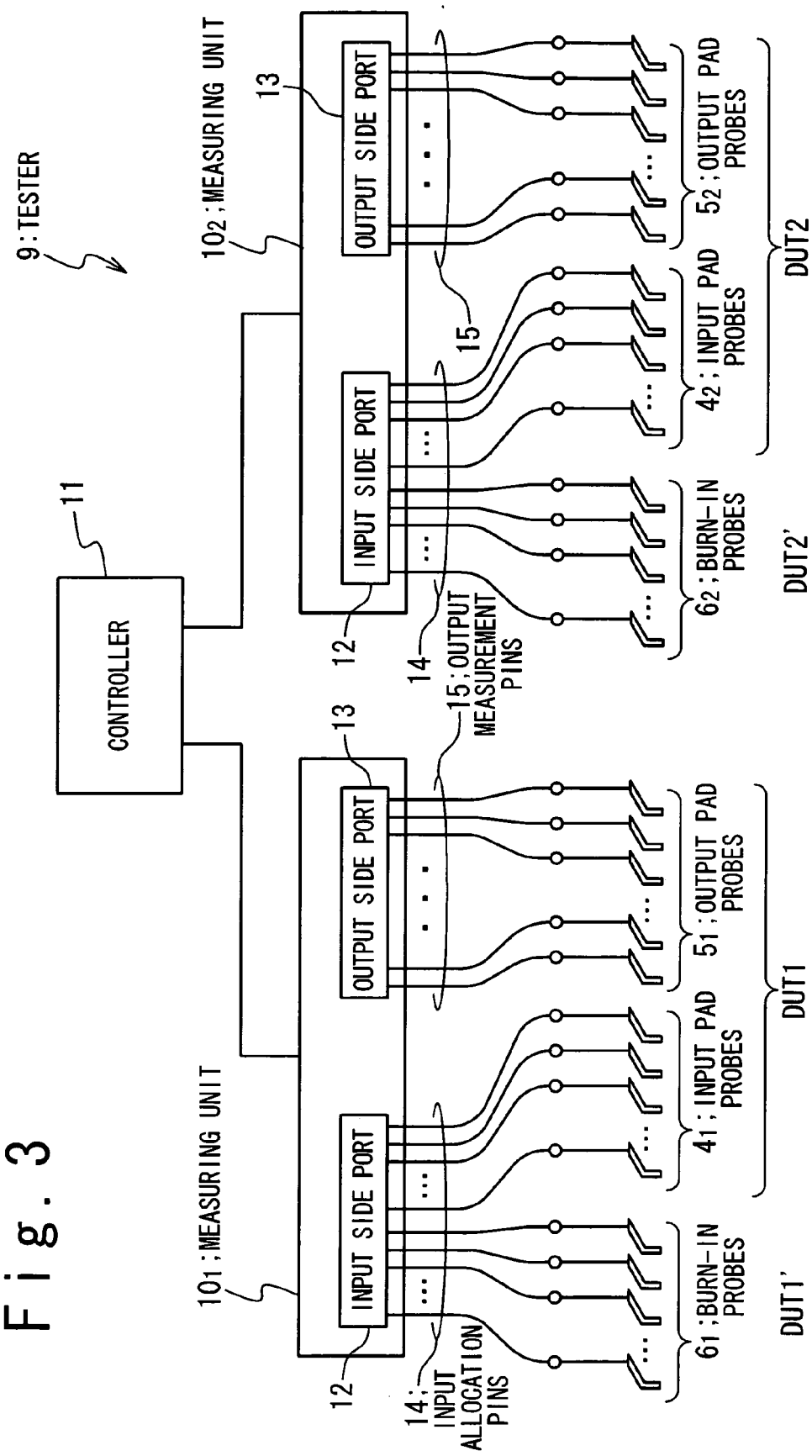
FIG. 3 is a block diagram showing a connection relation between the probe set for the probe card and a tester, in the first embodiment.

FIG. 3 is a block diagram showing the connection relation between the respective probes of the probe card 1 and the tester used to perform the operation test of the semiconductor device and to apply the stress. In FIG. 3, the tester is represented by a symbol 9. The tester 9 includes two measuring units $10_1$, $10_2$ and a controller 11. The measuring units $10_1$ and $10_2$ supply the inspection pattern and the stress pattern to the respective semiconductor devices, and also judge the presence or absence of the trouble of the respective semiconductor devices, from the output patterns outputted from the respective semiconductor devices. The controller 11 executes a measurement program prepared in advance in a memory inside it and requires the measuring units $10_1$ and $10_2$ to perform the desirable operation tests and apply the stresses.

Each of the measuring units $10_1$ and $10_2$ includes an input side port 12 and an output side port 13. The input side ports 12 are used to supply the inspection patterns used for the operation tests to the respective semiconductor devices DUT1 and DUT2. The input pad probes $4_1$ and $4_2$ of the probe card 1 are connected to input allocation pins 14 that are terminals placed in the input side ports 12 of the respective measuring units $10_1$ and $10_2$. On the other hand, the output side ports 13 are used to receive the output patterns outputted by the respective semiconductor device DUT1 and DUT2. The output pad probes $5_1$ and $5_2$ of the probe card 1 are connected to output measurement pins 15 that are terminals placed in the output side ports 13 of the respective measuring units $10_1$ and $10_2$. The measuring units $10_1$ and $10_2$ judge the presence or absence of the troubles of the respective semiconductor devices DUT1 and DUT2, from the received output patterns.

Each of the measuring units $10_1$ and $10_2$ basically includes the configuration for testing one semiconductor device. The measuring unit $10_1$ performs the operation test on the semiconductor device DUT1, and the measuring unit $10_2$ performs the operation test on the semiconductor device DUT2. The measuring unit $10_1$ and the measuring unit $10_2$ are operated at the same algorithm described in the measurement program prepared in the controller 11. However, each of them executes the operation test independently of each other.

In addition, in this embodiment, the measuring units $10_1$ and $10_2$ are doubly used to supply the stresses used for the burn-in to the respective semiconductor devices DUT1' and DUT2'. Concretely, the pins that are not connected to the input pad probes $4_1$ and $4_2$ among the input allocation pins 14 of the input side port 12, namely, the surplus pins are used to supply the stress patterns to the respective semiconductor devices DUT1' and DUT2'. The use of the surplus pins removes the necessity of providing the special apparatus to apply the stress pattern. Thus, this is advantageous for the improvement of the economical efficiency of the inspection.

Using the surplus pins of the input side port 12 to supply the stress pattern is further effective to enable the stress patterns to be applied to the respective semiconductor devices DUT1' and DUT2', under the constraint imposed on the many testers, namely, the constraint that all of the measuring units are operated under the same algorithm. The many testers, each of which has the plurality of measuring units to test the plurality of semiconductor devices at the same time, are not designed such that one of the plurality of measuring units executes an operation different from others. In other words, the many testers are not designed such that one measuring unit can perform the operation test on one semiconductor device and another measuring unit can apply the stress to another semiconductor device. However, if the surplus pins of the input side port 12 are used as shown in this embodiment, the typical tester can be used to perform the operation test on one semiconductor device and apply the stress to another semiconductor device.

The use of the surplus pins is especially effective in the case of using the semiconductor device where the number of the input signals to be supplied is smaller than the number of the output signals to be outputted, namely, the semiconductor device where the number of the input pads 7 is smaller than the number of the output pads 8. This is because in the foregoing semiconductor device, the many surplus pins are liable to occur in the input side port 12. As the example of the semiconductor device where the number of the input pads 7 is smaller than the number of the output pads 7, a liquid crystal driver is listed which is used to drive a data line of a liquid crystal panel.

Figure 4:
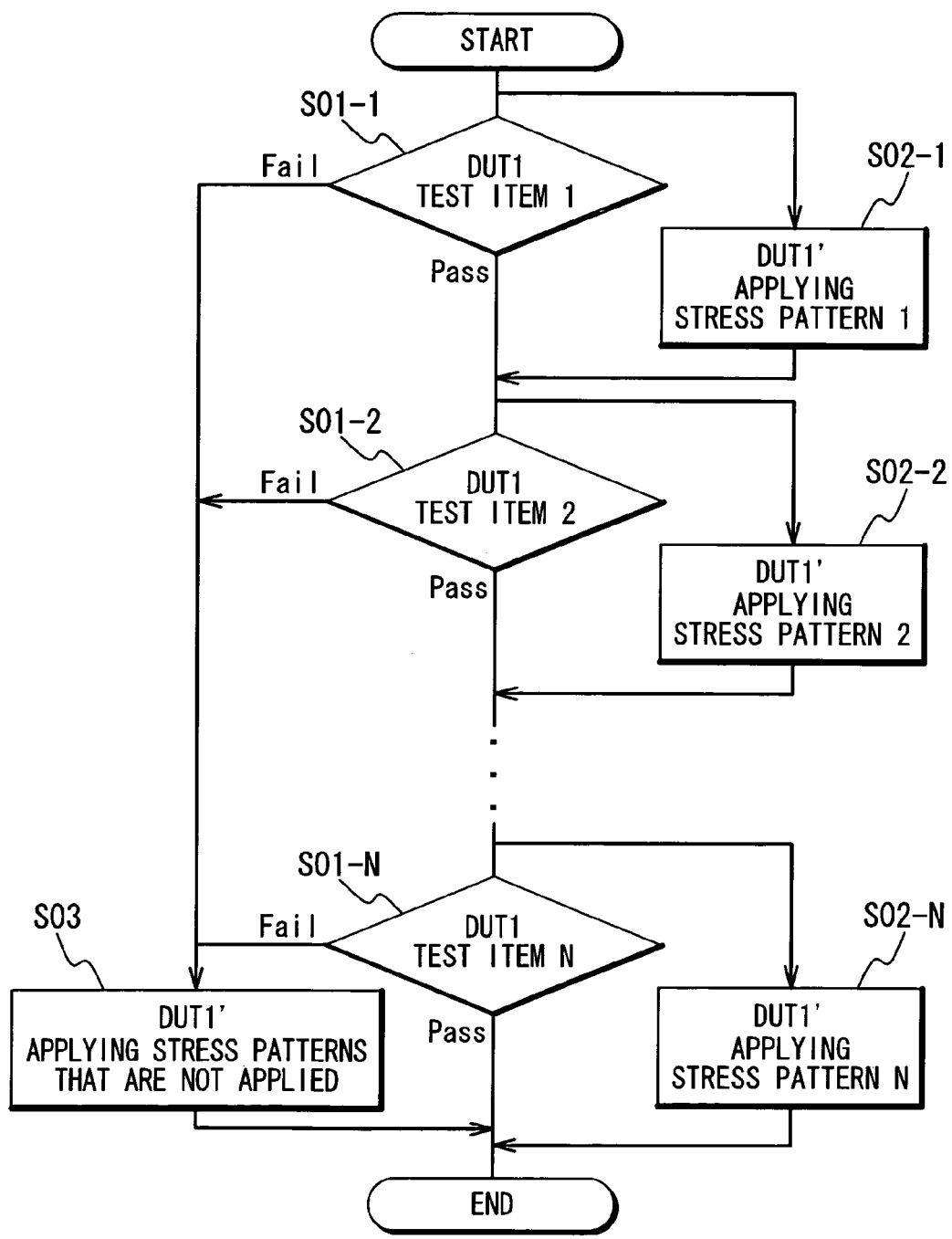
FIG. 4 is a flowchart showing a procedure in the first embodiment.

FIG. 4 is a flowchart showing a procedure preferable for the method for the wafer level burn-in test in this embodiment. FIG. 4 shows only the portions with regard to the operation test of the semiconductor device DUT1 and the applying of the stress to the semiconductor device DUT1', in the procedure of the wafer level burn-in test. The procedure where the operation test of the semiconductor device DUT2 and the applying of the stress to the semiconductor device DUT2' are executed in accordance with the similar procedure shown in FIG. 4. Also, the procedure where the procedure shown in FIG. 4 is attained when the controller 11 executes the measurement program built therein and controls the measuring units $10_1$ and $10_2$.

Under the control of the controller 11, the measuring unit $10_1$ sequentially performs the operation test with regard to a test item 1, a test item 2 to a test item N, on the semiconductor device DUT1 (Steps S01-1 to S01-N) As mentioned above, the operation test of the semiconductor device DUT1 is executed when the inspection pattern is supplied from the input side port 12 through the input pad probes $4_1$ to the semiconductor device DUT1, and the output pattern outputted by the semiconductor device DUT1 is received through the output pad probes $5_1$ by the output side port 13.

The measuring unit $10_1$, while performing the operation test with regard to the test items 1, 2 to N, executes the burn-in of the semiconductor device DUT1' (Steps S02-1 to S02-N). As mentioned above, the burn-in of the semiconductor device DUT1' is executed by supplying the stress pattern from the input side port 12 through the burn-in probe $6_1$ to the semiconductor device DUT1'. Concretely, the measuring unit $10_1$, while performing the operation test with regard to the test item 1, applies a stress pattern 1 to the semiconductor device DUT1'. The test items 2 to N after the test item 1 are similarly executed. During the execution of the operation test with regard to the test items 2 to N, the stress patterns 2 to N are applied to the semiconductor device DUT1', respectively. Consequently, the operation test of the semiconductor device DUT1 and the burn-in of the semiconductor device DUT1' are executed at the same time.

However, if a trouble is found out in the operation test of a certain test item, the operation tests after the operation test of the foregoing test item is skipped. This is because the supplying of a signal to the semiconductor device having the trouble is not preferable from the viewpoint of the safety of the operation test. For example, if a trouble is found out in the operation test of the test item j, the operation test with regard to the test items j+1 to N is not executed. In this case, stress patterns j+1 to N corresponding to the test items j+1 to N are separately applied (Step S03). Consequently, all of the predetermined stress patterns 1 to N to be applied in the burn-in are applied to the semiconductor device DUT1'.

When the operation test of the semiconductor device DUT1 and the burn-in of the semiconductor device DUT1' have been ended, the operation test of the semiconductor device DUT1' and the burn-in of the semiconductor device (not shown) adjacent to the semiconductor device DUT1' are executed in succession. The operation test of the semiconductor device DUT1' and the burn-in of the semiconductor device adjacent to it are also executed in accordance with the similar procedure.

In this way, the wafer level burn-in test method in this embodiment executes the operation test of the semiconductor device DUT1 and the burn-in of the semiconductor device DUT1' at the same time. Thus, the throughput of the operation test and burn-in is substantially improved, and the time necessary for the wafer level burn-in inspection is effectively reduced.

The procedure of the operation test and burn-in based on the flowchart of FIG. 4 is not available to a certain kind of a tester. Concretely, the tester, which is designed so as to stop the measuring unit connected to the semiconductor device when the trouble is found out in the semiconductor device, is not available for the procedure of the operation test and burn-in of FIG. 4. For example, if during the operation test of the semiconductor device DUT1, the trouble is found out to consequently stop the measuring unit $10_1$, the burn-in of the semiconductor device DUT1' to which the burn-in is applied by the measuring unit $10_1$ becomes imperfect. This is not preferable for the securing of the reliability of the semiconductor device DUT1'. On the other hand, the design for stopping the measuring unit when the trouble is found out in the semiconductor device is important to protect the tester.

Figure 5:
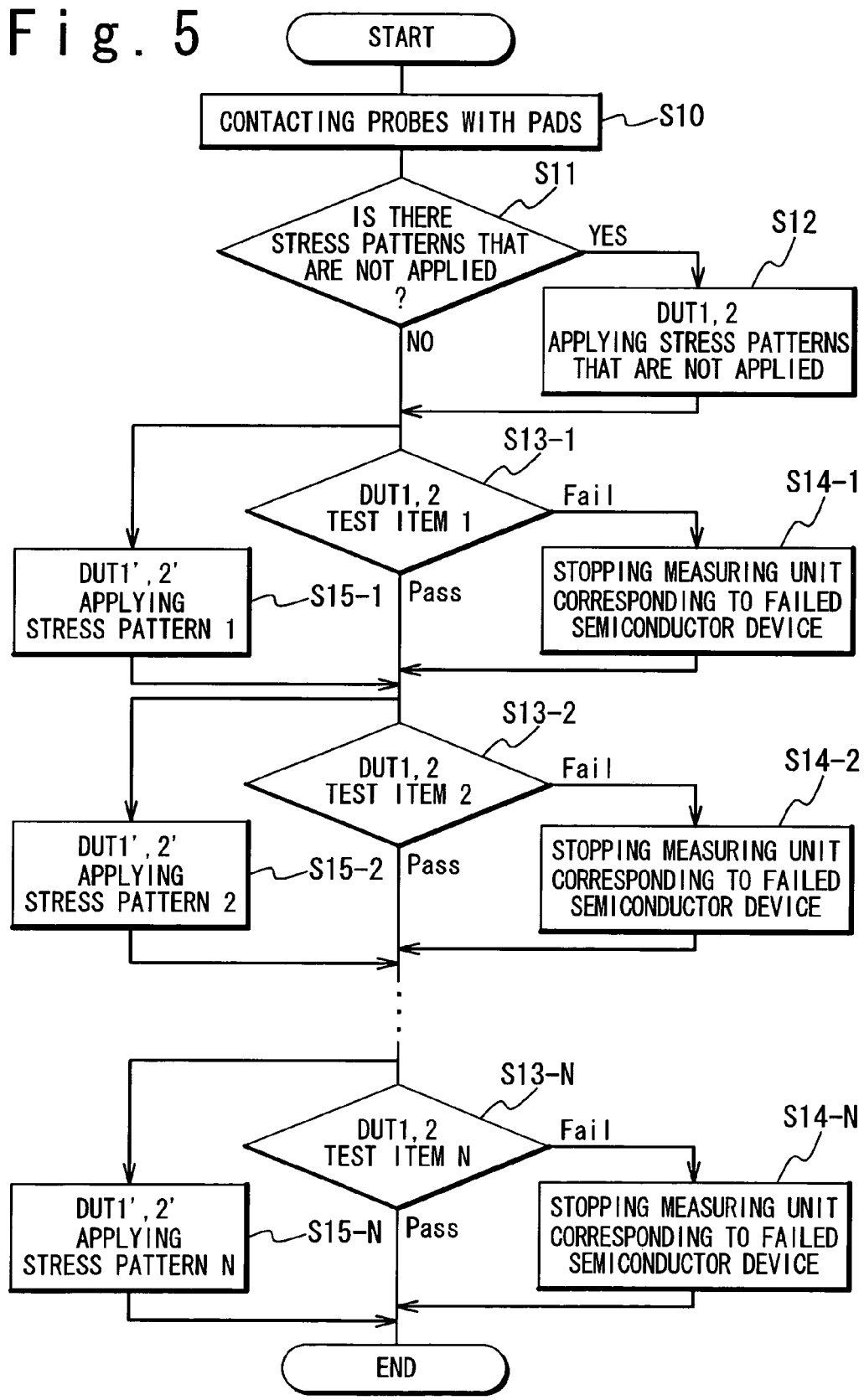
FIG. 5 is a flowchart showing another procedure in the first embodiment.

FIG. 5 is a flowchart showing another procedure of the operation test and burn-in available to the test of the foregoing tester in this embodiment. The procedure of FIG. 5 is attained when the controller 11 executes the measurement program built in it and controls the measuring units $10_1$ and $10_2$.

In the procedure shown in FIG. 5, firstly, the probes are brought into contact with the pads of the semiconductor devices DUT1, DUT2, DUT1' and DUT2'. The input pad probes $4_1$ and $4_2$ are brought into contact with the input pads 7 of the respective semiconductor devices DUT1 and DUT2, and the output pad probes $5_1$ and $5_2$ are brought into contact with the output pads 8 of the respective semiconductor devices DUT1 and DUT2. Moreover, the burn-in probes $6_1$ and $6_2$ are brought into contact with the input pads 7 of the respective semiconductor devices DUT1' and DUT2'.

In succession, prior to the operation tests of the semiconductor devices DUT1 and DUT2, whether or not there is the stress pattern that is not applied to the semiconductor devices DUT1 and DUT2 is judged (Step S11). This is because there is the possibility of the situation that, while the burn-in is applied to the semiconductor devices DUT1 and DUT2, if the trouble is found out in the operation test executed simultaneously with the burn-in, the measuring unit corresponding to the semiconductor device where the trouble is induced is stopped, and all of the stress patterns are not applied to the semiconductor devices DUT1 and DUT2.

If there is the stress pattern that is not applied to the semiconductor devices DUT1 and DUT2, the non-applied stress patterns are applied through the input pad probes $4_1$ and $3_2$ to the semiconductor devices DUT1 and DUT2 (S12). Consequently, the predetermined stress to be applied is applied to the semiconductor devices DUT1 and DUT2.

In succession, the operation tests with regard to the test items 1, 2 to N is sequentially performed on the semiconductor devices DUT1 and DUT2 (Steps S13-1 to S13-N) Moreover, during the execution of the operation tests with regard to the test items 1, 2 to N, the stress patterns 1, 2 to N are sequentially applied to the semiconductor devices DUT1' and DUT2' (Steps S15-1 to S15-N). The operation tests of the semiconductor devices DUT1 and DUT2 with regard to the test item i and the applying of the stress pattern i to the semiconductor devices DUT1', DUT2' are executed at the same time.

However, if the trouble is found out in the operation test of a certain test item, the measuring unit connected to the semiconductor device where the trouble is found out is stopped, and the operation test to be executed after the operation test of the forgoing test item and the applying of the stress pattern which are executed by the measuring unit are skipped (Steps S14-1 to S14-N).

For example, if the trouble is found out in the operation test of the test item j with regard to the semiconductor device DUT1, the measuring unit $10_1$ skips the operation test with regard to the test items j+1 to N of the semiconductor device DUT1 and the applying of the stress patterns j+1 to N of the semiconductor device DUT1'. Consequently, the measuring unit $10_1$ is protected.

However, the fact that the applying of the stress patterns j+1 to N is skipped leads to a result that the predetermined stress is not applied to the semiconductor device DUT1'. For this reason, after the completion of the operation test of the semiconductor device DUT1, when the operation test of the semiconductor device DUT1' is executed, the skipped stress patterns j+1 to N are applied to the step S12. Consequently, all of the stress patterns to be applied are applied to the semiconductor device DUT1'.

In this way, the procedure of FIG. 5 is suitable for the tester which is designed so as to stop the measuring unit connected to the semiconductor device when the trouble is found out in the semiconductor device, and is used to execute the wafer level burn-in test method according to the present invention.

Second Embodiment

In the second embodiment, the present invention is applied to the burn-in of the semiconductor device employing the TAB.

Figure 6:
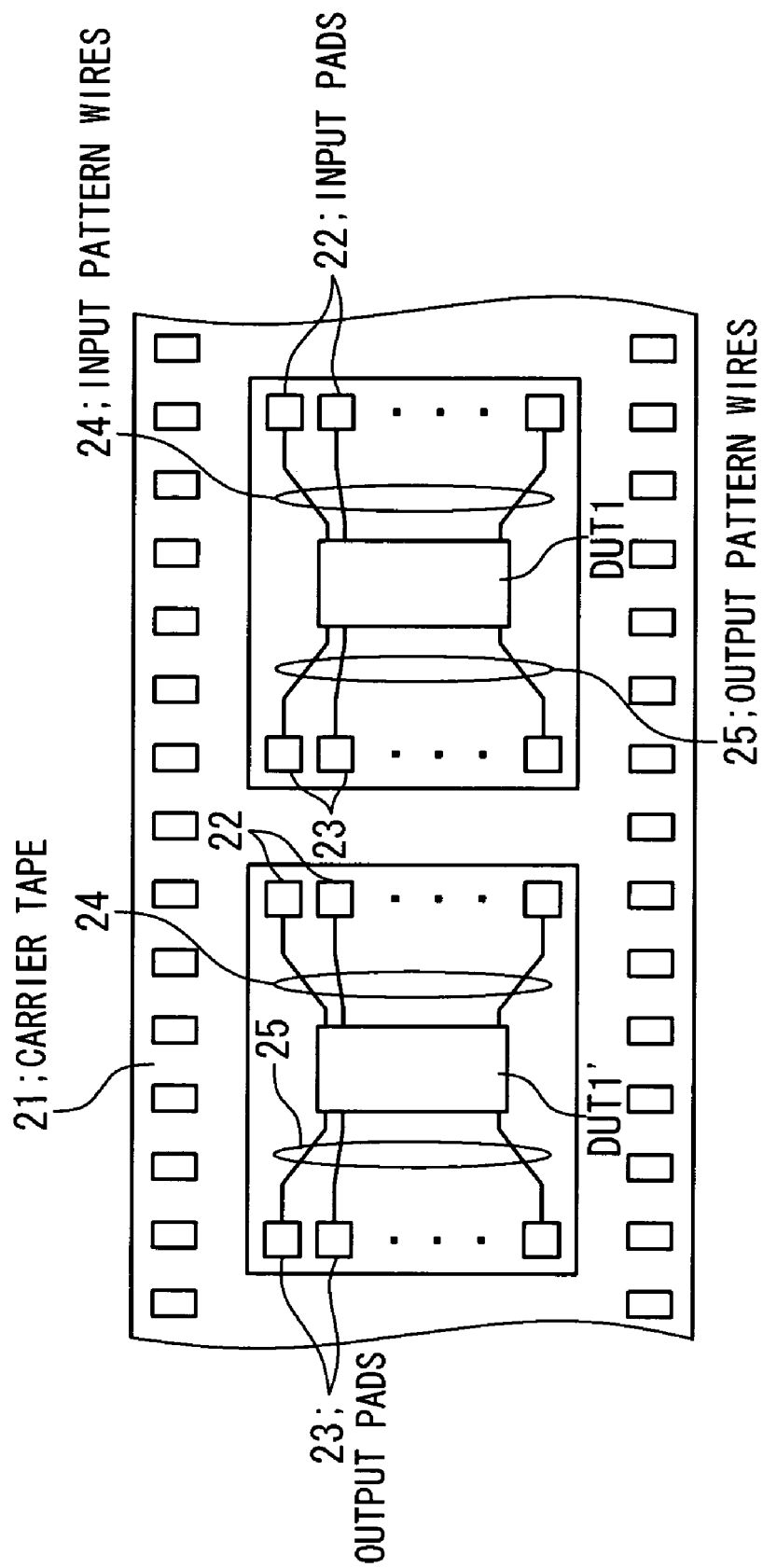
FIG. 6 is a conceptual view showing a packaging manner of a semiconductor device tested in a second embodiment.

FIG. 6 is a conceptual view showing the structure of the semiconductor device in which the TAB is employed in the packaging. The semiconductor devices DUT1 and DUT1' are joined to a carrier tape 21. Input pads 22 and output pads 23 are formed on the carrier tape 21. The input pads 22 are the pads used to supply the input signals from the outside to the semiconductor devices DUT1 and DUT1'. The input pads 22 are connected through input pattern wires 24 to the semiconductor devices DUT1 and DUT1'. On the other hand, the output pads 23 are the pads used to output the output signals from the semiconductor devices DUT1 and DUT1', and the output pads 23 are connected through output pattern wires 25 to the semiconductor devices DUT1 and DUT1'.

Figure 7:
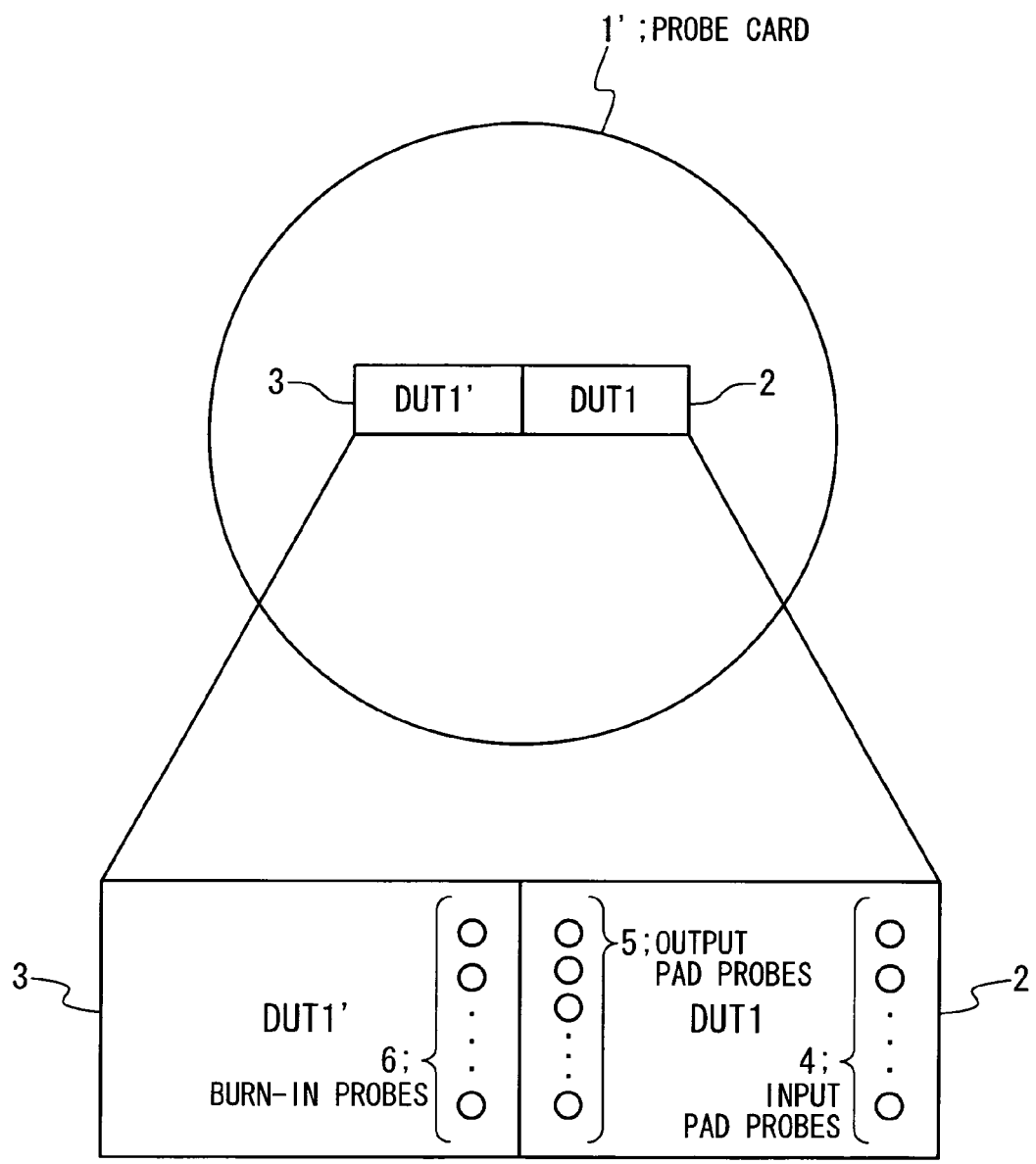
FIG. 7 is a conceptual view showing a configuration of a probe card used in the second embodiment.

FIG. 7 is a conceptual view showing a configuration of a probe card 1' used in the method of the burn-in test in this embodiment. The probe card 1' is designed so as to be able to perform the operation test on one semiconductor device and apply the burn-in to another one semiconductor device at the same time. Concretely, two DUT regions 2 and 3 are provided in the probe card 1'. The DUT regions 2 and 3 correspond to the semiconductor devices DUT1 and DUT1', respectively. To clarify this correspondence, symbols [DUT1] and [DUT1'] are given to the DUT regions 2 and 3, respectively. Input pad probes 4 and output pad probes 5 are provided in the DUT region 2, and a burn-in probes 6 is provided in the DUT region 3. The input pad probes 4 and the output pad probes 5 are the probes used to perform the operation test on the semiconductor device DUT1, and the burn-in probes 6 are the probes used to apply the stress for the burn-in to the semiconductor device DUT1'.

Similarly to the first embodiment, all of the input pad probes 4, the output pad probes 5 and the burn-in probes 6 are connected to the same measuring unit. In other words, the measuring unit used for the operation test of the semiconductor device DUT1 is doubly used to supply the stress for the burn-in to the semiconductor device DUT1' This is advantageous for the effective use of the surplus pins of the measuring unit and for the improvement of the economic efficiency of the inspection.

Similarly to the first embodiment, the method of the burn-in test in this embodiment executes the operation test of the semiconductor device DUT1 and the burn-in of the semiconductor device DUT1' at the same time. Consequently, the improvement of the throughput is attained.

Figure 8:
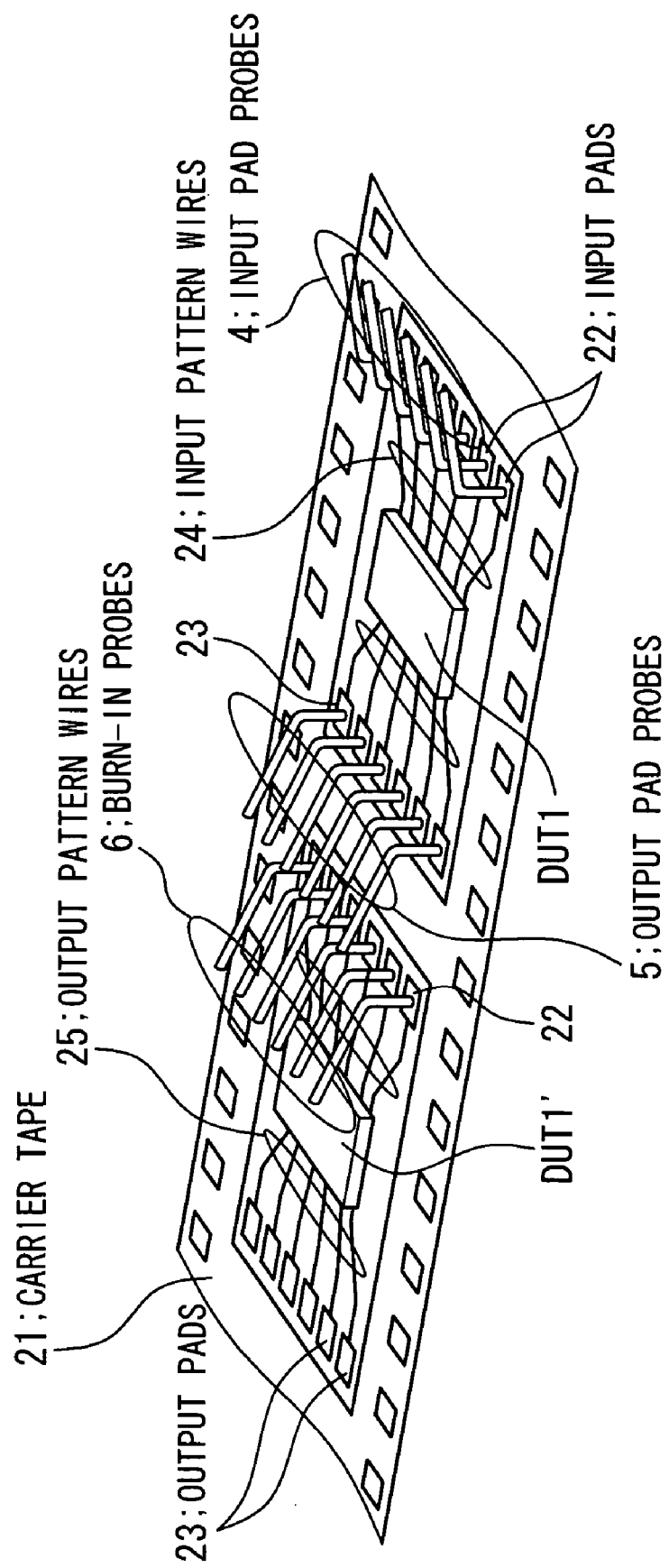
FIG. 8 is a perspective view showing a connection relation between a probe set for the probe card and an input pad and an output pad which are placed in a carrier tape, in the second embodiment.

FIG. 8 is a perspective view showing a connection relation between the respective probes of the probe card 1' and the pads provided in the semiconductor device in this embodiment. As shown in FIG. 8, the respective probes of the probe card 1' are connected with the input pads 22 and the output pads 23 formed on the carrier tape 21. The input pads 22 and the output pads 23 connected to the semiconductor device DUT1 are connected to the input pad probes 4 and the output pad probes 5 respectively. On the other hand, the input pads 22 connected to the semiconductor device DUT1' is connected to the burn-in probes 6. Moreover, the inspection pattern is supplied through the input pad probes 4 to the semiconductor device DUT1, and the output pattern outputted from the semiconductor device DUT1 is outputted through the output pad probes 5 to the tester. Simultaneously with this, the stress for the burn-in is supplied through the burn-in probes 6 to the semiconductor device DUT1'. Consequently, the operation test of the semiconductor device DUT1 and the burn-in of the semiconductor device DUT1' are executed at the same time. After the completion of the operation test of the semiconductor device DUT1 and the burn-in of the semiconductor device DUT1', the operation test of the semiconductor device DUT1' and the burn-in of the semiconductor device (not shown) adjacent to the semiconductor device DUT1' are executed at the same time. The foregoing procedure substantially improves the throughput of the operation test and burn-in and effectively reduces the time necessary for the burn-in test.

As the detailed burn-in procedure, the fact that the procedure (FIGS. 4 and 5) used in the first embodiment can be also used in this embodiment may be evidently understood by those skilled in the art.

As explained above, in this embodiment, with regard to the semiconductors employing the TAB, the operation test and burn-in of the two semiconductor devices are executed at the same time, and the reduction in the testing time is consequently attained. Incidentally, the fact that the method of the burn-in test in this embodiment can be applied to another mounting technique using the carrier tape, for example, COF may be evidently understood by those skilled in the art.

According to the present invention, it is possible to reduce the testing time necessary for the burn-in test that executes the burn-in by bringing the probe into contact with the semiconductor device.

It is apparent that the present invention is not limited to the above embodiment, that may be modified and changed without departing form the scope and spirit of the invention.

What is claimed is:

1. A method for a burn-in test comprising:
   (a) executing an operation portion of a burn-in test of a first semiconductor device through first probes provided on a probe card; and
   (b) applying a stress as another portion of the burn-in test to a second semiconductor device through second probes provided on said probe card while said operation portion of the burn-in test is executed; and
   (c) stopping said operation test when a trouble is found in said first semiconductor device by said operation test,
   wherein said step (b) is continued until applying of a predetermined stress to said second semiconductor device is finished, even after said operation test is stopped.

2. The method for a burn-in test according to claim 1, wherein said first semiconductor device and said second semiconductor device are formed on a same substrate.

3. The method for a burn-in test according to claim 2, wherein said substrate is a semiconductor wafer.

4. The method for a burn-in test according to claim 1,
   wherein said first semiconductor device and said second semiconductor device are formed on a same substrate, and
   wherein said substrate is a carrier tape.

5. The method for a burn-in test according to claim 1, wherein one measuring unit is used for said operation test of said first semiconductor device and said applying of said stress to said second semiconductor device, said one measuring unit includes an input side port and an output side port,
   wherein said operation test is executed by supplying an inspection pattern to said first semiconductor device through first terminals of input allocation terminals provided in said input side port and receiving an output pattern from said first semiconductor device through said output side port, and
   wherein said applying of said stress is executed by applying a stress pattern to said second semiconductor device through second terminals of said input allocation terminals provided in said input side port.

6. The method for a burn-in test according to claim 5, further comprising:

(d) stopping said operation test of said first semiconductor device and said applying of said stress to said second semiconductor device when a trouble is found in said first semiconductor device;
   (e) releasing said first terminals of said input allocation terminals from said first semiconductor device and contacting said first terminals with said second semiconductor device;
   (f) applying remained stress to be applied to said second semiconductor device to said second semiconductor device through said first terminals; and
   (g) executing an operation test of said second semiconductor device after said step (f).

7. The method for a burn-in test according to claim 5, wherein each of said first semiconductor device and said second semiconductor device includes:
   input terminals which are used to receive said inspection pattern, and
   output terminals which are used to output said output pattern,
   wherein a number of said input terminals is smaller than a number of said output terminals.

8. A computer program product used for a method for a burn-in test, embodied on a computer-readable medium in a tester and comprising code that, when executed, causes a computer of said tester to perform the following:
   (a) executing an operation portion of a burn-in test of a first semiconductor device through first probes provided on a probe card;
   (b) applying a stress as another portion of the burn-in test to a second semiconductor device through second probes provided on said probe card while said operation test is executed; and
   (c) stopping said operation test when a trouble is found in said first semiconductor device by said operation test,
   wherein said step (b) is continued until applying of a predetermined stress to said second semiconductor device is finished, even after said operation test is stopped.

9. The computer program product according to claim 8, wherein said first semiconductor device and said second semiconductor device are formed on a same substrate, and
   said substrate is one of a semiconductor wafer or a carrier tape.

10. The computer program product according to claim 8, further comprising code that, when executed, causes said computer to further perform the following:
    (d) stopping said operation test of said first semiconductor device and said applying of said stress to said second semiconductor device when a trouble is found in said first semiconductor device;
    (e) releasing terminals, which is used for the operation test, of a measuring unit of said tester from said first semiconductor device and contacting said terminals with said second semiconductor device;
    (f) applying remained stress to be applied to said second semiconductor device to said second semiconductor device through said terminals; and
    (g) executing an operation test of said second semiconductor device after said step (f).

* * * * *